US012695050B2

(12) United States Patent
Ehberger et al.

(10) Patent No.: US 12,695,050 B2
(45) Date of Patent: Jul. 28, 2026

(54) METHOD OF DETERMINING A BEAM CONVERGENCE OF A CHARGED PARTICLE BEAM, AND CHARGED PARTICLE BEAM SYSTEM

(71) Applicant: ICT Integrated Circuit Testing Gesellschaft für Halbleiterprüftechnik mbH, Heimstetten (DE)

(72) Inventors: Dominik Ehberger, Ebersberg (DE); John Breuer, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 345 days.

(21) Appl. No.: 18/225,283

(22) Filed: Jul. 24, 2023

(65) Prior Publication Data

US 2025/0037965 A1 Jan. 30, 2025

(51) Int. Cl.
*H01J 37/22* (2006.01)
*G06T 7/00* (2017.01)
*H01J 37/21* (2006.01)

(52) U.S. Cl.
CPC .......... *H01J 37/222* (2013.01); *G06T 7/0002* (2013.01); *H01J 37/21* (2013.01); *G06T 2207/10061* (2013.01); *H01J 2237/24578* (2013.01)

(58) Field of Classification Search
CPC ..................... H01J 37/222; H01J 37/21; H01J 2237/24578; G06T 7/0002; G06T 2207/10061
See application file for complete search history.

(56) References Cited

U.S. PATENT DOCUMENTS 6,107,637 A * 8/2000 Watanabe ............. H01J 37/222
250/548
2020/0286707 A1* 9/2020 Maassen ................. H01J 37/21

\* cited by examiner

*Primary Examiner* — Georgia Y Epps
*Assistant Examiner* — Hanway Chang
(74) *Attorney, Agent, or Firm* — Kilpatrick Townsend & Stockton LLP

(57) ABSTRACT

A method of determining a beam convergence of a charged particle beam (11) focused by a focusing lens (120) toward a sample (10) in a charged particle beam system (100), comprising: (a) taking one or more images ($h_{1 \ldots N}$) of the sample when the sample is arranged at one or more defocus distances ($z_{1 \ldots N}$) from a respective beam focus of the charged particle beam, and retrieving one or more retrieved beam profiles ($g_{1 \ldots N}$) from the one or more images ($h_{1 \ldots N}$); (b) simulating one or more beam profiles at the one or more defocus distances ($z_{1 \ldots N}$) based at least on an estimated beam convergence value ($^{initial}C$) of the charged particle beam to provide one or more simulated beam profiles ($g'_{1 \ldots N}$); (c) determining a magnitude (R) of a difference between the one or more simulated beam profiles ($g'_{1 \ldots N}$) and the one or more retrieved beam profiles ($g_{1 \ldots N}$); and (d) varying the estimated beam convergence value in an iterative process for reducing or minimizing said magnitude (R) to determine an actual beam convergence value ($^{actual}C$). Furthermore, a charged particle beam system for imaging and/or inspecting a sample that is configured for any of the methods described herein is provided.

20 Claims, 3 Drawing Sheets

METHOD OF DETERMINING A BEAM CONVERGENCE OF A CHARGED PARTICLE BEAM, AND CHARGED PARTICLE BEAM SYSTEM

TECHNICAL FIELD

Embodiments described herein relate to methods of determining a beam convergence of a charged particle beam focused by a focusing lens toward a sample in a charged particle beam system, particularly in a scanning electron microscope (SEM). Specifically, the numerical aperture (NA) provided by a focusing lens in a charged particle beam system can be determined according to the methods described herein. Embodiments further relate to charged particle beam systems for inspecting and/or imaging a sample that are configured for carrying out any of the methods described herein.

BACKGROUND

Modern semiconductor technology has created a high demand for structuring and probing specimens on a nanometer or even sub-nanometer scale. Micrometer and nanometer-scale process control, inspection or structuring is often carried out using charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits, exposure systems for lithography, detecting systems, defect-inspection tools, and testing systems for integrated circuits. In particle beam systems, fine beam probes with a high current density can be used. For instance, in the case of an SEM, the primary electron beam generates signal particles such as secondary electrons (SE) and/or backscattered electrons (BSE) that can be used to image and/or inspect a sample.

Reliably inspecting and/or imaging samples with a charged particle beam system at a good resolution is, however, challenging. Specifically, the charged particle beam typically suffers from beam aberrations that limit resolution, and the actual cross-sectional shape of a focused charged particle beam may be different from the design shape. The resolution limit of a charged particle beam system is determined by the numerical aperture (NA) of the charged particle beam that is focused by an objective lens onto a surface of the sample.

The numerical aperture (NA) of a charged particle beam is a magnitude that is typically used to describe the beam convergence of the charged particle beam focused on the sample surface by the objective lens. A large numerical aperture provides an improved resolution limit that can theoretically be reached if beam aberrations are low. The system may be designed for a specific numerical aperture that provides an excellent operation, but the actual numerical aperture may deviate from the expected value. Therefore, knowledge of the beam convergence of a charged particle beam focused by a focusing lens, and more specifically knowledge of the actual numerical aperture of the charged particle beam, would be beneficial for determining sources of beam aberrations and for improving the resolution of the system.

In view of the above, it would be beneficial to accurately and reliably determine the beam convergence of a charged particle beam focused by a focusing lens in a charged particle beam system, in particular to accurately determine the numerical aperture of the charged particle beam focused by the objective lens. Further, it would be beneficial to provide a charged particle beam system for inspecting and/or imaging a sample that is configured for being operated in accordance with any of the methods described herein.

SUMMARY

In light of the above, methods of determining a beam convergence of a charged particle beam and charged particle beam systems configured therefor are provided according to the independent claims.

According to a first aspect, a method of determining a beam convergence of a charged particle beam focused by a focusing lens toward a sample in a charged particle beam system is provided. The method includes: (a) taking one or more images of the sample when the sample is arranged at one or more defocus distances from a respective beam focus of the charged particle beam, and retrieving one or more retrieved beam profiles from the one or more images; (b) simulating one or more beam profiles at the one or more defocus distances based at least on an estimated beam convergence value of the charged particle beam to provide one or more simulated beam profiles; (c) determining a magnitude (R) of a difference between the one or more simulated beam profiles and the one or more retrieved beam profiles; and (d) varying the estimated beam convergence value in an iterative process for reducing or minimizing said magnitude (R) to determine an actual beam convergence value.

In some embodiments, the actual beam convergence value contains information about a change of beam width as a function of defocus distance. In particular, the actual beam convergence value may contain or be the numerical aperture (NA) of the charged particle beam.

In some embodiments, a focus image of the sample is also taken (when the sample is arranged at the focal distance from the focusing lens), and said focus image of the sample can be used in (a) for retrieving the one or more retrieved beam profiles from the one or more images taken at the one or more defocus distances. A focus image of the sample can also be otherwise known and can then be used for retrieving the one or more retrieved beam profiles in (a).

According to a second aspect, an alternative method of determining a beam convergence of a charged particle beam focused by a focusing lens toward a sample in a charged particle beam system is provided. The method includes: (a) taking one or more images of the sample when the sample is arranged at one or more defocus distances from a respective beam focus of the charged particle beam to provide one or more taken images; (b) simulating one or more images of the sample taken at the one or more defocus distances based at least on an estimated beam convergence value of the charged particle beam and on a focus image of the sample to provide one or more simulated images; (c) determining a magnitude (R) of a difference between the one or more taken images and the one or more simulated images; and (d) varying the estimated beam convergence value in an iterative process for reducing or minimizing said magnitude (R) to determine an actual beam convergence value.

According to another aspect, a charged particle beam system for imaging and/or inspecting a sample with a charged particle beam, particularly with an electron beam, is provided. The charged particle beam system includes a charged particle source for emitting a charged particle beam propagating along an optical axis, a sample stage, a focusing lens for focusing the charged particle beam toward a sample placed on the sample stage, a charged particle detector for detecting signal particles emitted from the sample, and a processor and a memory storing instructions that, when executed by the processor, cause the system to perform any of the methods described herein.

In particular, the instructions, when executed, cause the system: (x1) to simulate one or more beam profiles at one or more defocus distances based at least on an estimated beam convergence value of the charged particle beam to provide one or more simulated beam profiles; (x2) to compare one or more retrieved beam profiles retrieved from one or more images of the sample taken at the one or more defocus distances and the one or more simulated beam profiles for determining a magnitude of a difference therebetween; and (x3) to vary the estimated beam convergence value in an iterative process for reducing or minimizing said magnitude to determine an actual beam convergence value, particularly to determine the actual numerical aperture (NA).

Alternatively, the instructions, when executed, cause the system: (x1) to simulate one or more images of the sample taken at one or more defocus distances based at least on an estimated beam convergence value of the charged particle beam and on a focus image of the sample to provide one or more simulated images; (x2) determining a magnitude of a difference between one or more taken images of the sample taken at the one or more defocus distances and the one or more simulated images; and (x3) to vary the estimated beam convergence value in an iterative process for reducing or minimizing said magnitude to determine an actual beam convergence value, particularly to determine the actual numerical aperture (NA).

Embodiments are also directed at apparatuses for carrying out the disclosed methods and include apparatus parts for performing the individual method actions. The described method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Furthermore, features illustrated or described as part of one embodiment can be used on or in conjunction with other embodiments to yield yet a further embodiment. It is intended that the description includes such modifications and variations.

Figure 1:
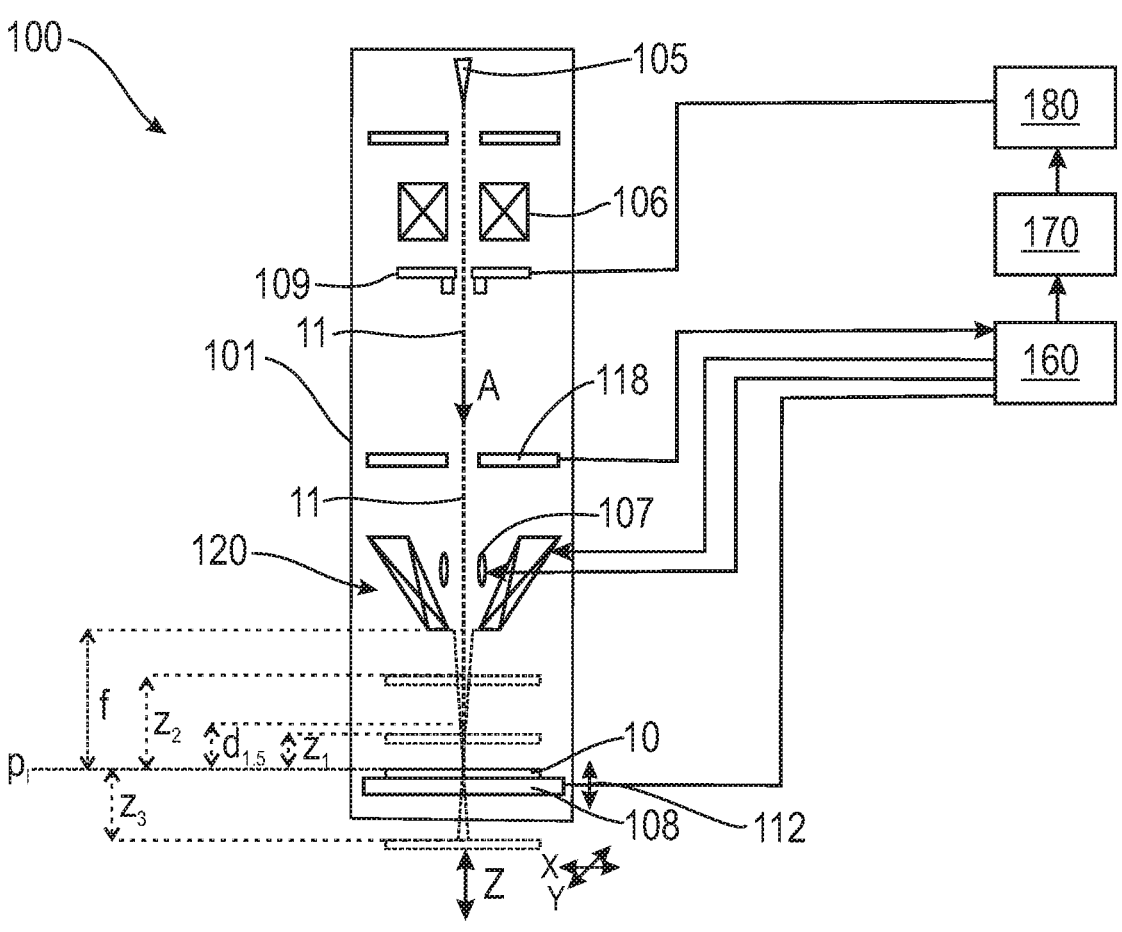
FIG. 1 shows a schematic view of a charged particle beam system according to embodiments described herein that is adapted for being operated according to any of the methods described herein.

FIG. 1 is a schematic view of a charged particle beam system 100 for inspecting and/or imaging a sample 10 according to embodiments described herein. The charged particle beam system 100 includes a charged particle source 105, particularly an electron source, for emitting a charged particle beam 11, particularly an electron beam, propagating along an optical axis A. The charged particle beam system 100 further includes a sample stage 108 and a focusing lens 120, particularly an objective lens, for focusing the charged particle beam 11 on the sample 10 that is placed on the sample stage 108. The charged particle beam system 100 further includes a charged particle detector 118, particularly an electron detector, for detecting signal particles (in particular secondary electrons and/or backscattered electrons) emitted from the sample 10.

An image generation unit 160 may be provided for generating one or more images of the sample 10 based on the charged particle signal received from the charged particle detector 118. The image generation unit 160 can forward the one or more images of the sample to a processing unit 170 that is configured to determine at least one beam convergence value of the charged particle beam in accordance with the methods described herein.

The at least one beam convergence value can be used, e.g., for at least one of tailoring and correcting the charged particle beam. For example, a set of beam aberration coefficients can be determined in an iterative process that uses the beam convergence value as an input parameter. The beam aberration coefficients can be forwarded to a controller 180 of a beam influencing element 109, for example an aberration corrector, such that the beam influencing element 109 can be adjusted appropriately for correcting aberrations of the charged particle beam. Alternatively or additionally, the controller 180 can control other elements of the charged particle beam system 100, for example the charged particle source 105 or the focusing lens 120. The charged particle beam 11 may exemplarily be tailored in a way such that the charged particle beam system 100 has a specific beam convergence value, for example substantially the same beam convergence value as another charged particle beam system. For example, if the determined actual beam convergence value deviates from an expected value, one or more beam-optical components of the system may be adapted for modifying the actual beam convergence value in order to come close to the expected value.

The sample stage 108 may be a movable stage. In particular, the sample stage 108 may be movable in the Z-direction, i.e., in the direction of the optical axis A, such that the distance between the focusing lens 120 and the sample 10 can be varied (see arrow 112 in FIG. 1). By moving the sample stage 108 in the Z-direction, the sample 10 can be moved to different defocus distances, $z_1$, $z_2$, $z_3$, i.e., away from a focal plane $p_l$ of the focusing lens 120, such that out-of-focus images of the sample 10 can be taken by a respective stage movement, e.g. in predetermined increments. In some embodiments, at least one of the out-of-focus images of the sample 10 is taken at a defocus distance smaller than 2 times a depth of focus, smaller than 1.5 times a depth of focus ($d_{1.5}$), smaller than 1.2 times a depth of focus, or within a depth of focus. The depth of focus can be described as a distance from the beam focus at which non-linear effects start to significantly influence the dependency between the defocus distance and a beam profile diameter. In other words, a dependency between the defocus distance and the size of the beam profile is (significantly) non-linear at defocus distances smaller than or equal to the "depth of focus". In some embodiments, the depth of focus may also be described as Rayleigh-length or confocal parameter.

In some embodiments, the sample stage 108 may also be movable in a plane perpendicular to the optical axis A (also referred to herein as the X-Y-plane). By moving the sample stage 108 in the X-Y-plane, a specified surface region of the sample 10 can be moved into an area below the focusing lens 120, such that the specified surface region can be imaged by focusing the charged particle beam 11 thereon.

The beam-optical components of the charged particle beam system 100 are typically placed in a vacuum chamber 101 that can be evacuated, such that the charged particle beam 11 can propagate along the optical axis A from the charged particle source 105 toward the sample stage 108 and hit the sample 10 at a sub-atmospheric pressure, e.g. a pressure below $10^{-3}$ mbar or a pressure below $10^{-5}$ mbar.

In some embodiments, the charged particle beam system 100 may be an electron microscope, particularly a scanning electron microscope. A scan deflector 107 may be provided for scanning the charged particle beam 11 over a surface of the sample 10 along a predetermined scanning pattern, e.g., in the X-direction and/or in the Y-direction.

In some embodiments, a condenser lens system 106 may be arranged downstream of the charged particle source 105, particularly for collimating the charged particle beam 11 propagating toward the focusing lens 120. In some embodiments, the focusing lens 120 is an objective lens configured to focus the charged particle beam 11 on the sample 10, particularly a magnetic objective lens, an electrostatic magnetic lens, or a combined magnetic-electrostatic lens. The objective lens may optionally include a retarding field device, e.g. one or more retarding electrodes, configured to decelerate the charged particle beam to a predetermined landing energy on the sample.

One or more surface regions of the sample 10 can be inspected and/or imaged with the charged particle beam system 100. The term "sample" as used herein may relate to a substrate, e.g., with one or more layers or features formed thereon, a semiconductor wafer, a glass substrate, a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 is typically focused on a sample surface with the focusing lens 120. Secondary electrons and/or backscattered electrons are emitted from the sample when the charged particle beam 11 impinges on the sample surface. The signal electrons provide information about spatial characteristics and dimensions of features of the sample and can be detected with the charged particle detector 118. By scanning the charged particle beam 11 over the sample surface, e.g. with the scan deflectors 107, and detecting the signal electrons as a function of the generation position of the signal electrons, the sample surface or a portion thereof can be imaged, e.g., with the image generation unit 160 that may be configured to provide an image of the sample 10 based on the received signal electrons.

A small spot of the focused charged particle beam 11 on the sample surface increases the obtainable image resolution. Accordingly, the sample surface should be arranged in the focal plane $p_l$ of the focusing lens 120 during the inspection, in order to obtain a sharp in-focus image of the sample 10. A sharp image of the sample 10 (also referred to as "high-resolution image") taken in-focus is also referred to herein as a "focus image $h_i$", the subscript/designating "In focus". Similarly, the beam profile of the charged particle beam 11 in the focal plane $p_l$ is referred to herein as a "focus beam profile $g_i$", the subscript/designating "In focus". In some embodiments, the sharp image of the sample 10 taken in-focus can also be provided by measurements using other instruments or using simulations of the sample.

An image can be mathematically presented in real space (=in the image domain, i.e. as a function of the spatial coordinates) or in Fourier space (=in the frequency domain, i.e. as a function of spatial frequency). An image in Fourier space can be calculated from an image in real space via a Fourier transformation (FT). Both above representations contain corresponding information regarding the image. Images and beam profiles in real space can be Fourier transformed into Fourier space, and vice versa, via a fast Fourier transform (FFT) algorithm in some of the embodiments described herein.

The actual value of the beam convergence of the charged particle beam focused by the focusing lens 120 onto the sample is typically unknown in charged particle beam systems. The beam convergence may be expressed in terms of the beam convergence angle (a) relative to the optical axis or in terms of the numerical aperture (NA) of the charged particle beam, which values are difficult to determine—being "longitudinal properties" of the beam that are hidden and not directly available from an image. The numerical aperture (NA) determines the resolution limit, such that knowledge of the actual value of the numerical aperture would be highly valuable.

For example, the numerical aperture of a system is often used for adapting and designing the beam-influencing elements (such as the objective lens) of the system, which may lead to inaccuracies and beam aberrations in the event that the numerical aperture that is actually present in the charged particle beam system deviates from the design numerical aperture that was assumed for the system design. Beam-influencing elements may include one or more elements of the group consisting of: a lens, a beam extractor, a beam deflector, a collimator, an aberration corrector, a scan deflector, a beam separator, and a charged particle detector. Therefore, determining the actual numerical aperture can be helpful for identifying sources of inaccuracies in the system and for optimizing the system design and the resolution. Also, the numerical aperture as a magnitude that expresses the beam convergence can be used as an input parameter in an aberration coefficient determination routine.

The numerical aperture (NA) of a charged particle beam system can be roughly estimated as follows (=first NA-determination method): A ratio between an estimated beam width at the position of the objective lens and a distance between the sample and the objective lens (when the sample is arranged approximately at a focus position) can be calculated, and the NA can be calculated based on said ratio. However, the obtained NA-value may be inaccurate.

A more accurate method of determining the numerical aperture (NA) of a charged particle beam system is as follows (=second NA-determination method): One or more beam widths of the charged particle beam are retrieved from one or more defocus images of a sample, and the numerical aperture is calculated based on an average change of beam width as a function of the defocus distance. However, the accuracy of the second NA-determination method may suffer if one or more of the defocus distances are located within a depth-of-focus range because—as mentioned above—a dependency between beam widths and defocus distances is significantly non-linear within a range close to the beam focus.

In view of the above, according to methods described herein, at least one beam convergence value of the charged particle beam, particularly the numerical aperture (NA), can be reliably and accurately determined, particularly independently of the choice of defocus distances. The charged particle beam system 100 of FIG. 1 may include a processor and a memory (shown in FIG. 1 as the processing unit 170) storing instructions that, when executed by the processor, cause the system to perform any of the methods described herein.

Figure 2:
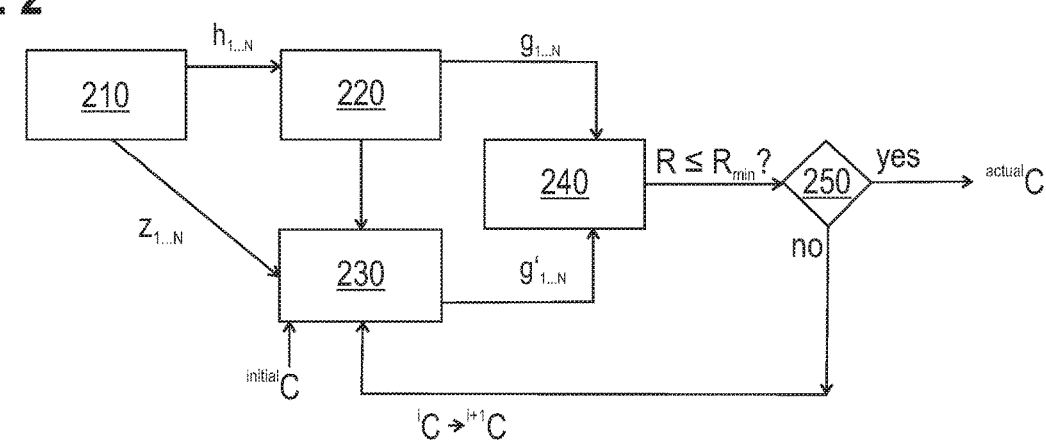
FIG. 2 shows a flow diagram illustrating a method of determining a beam convergence of a charged particle beam according to embodiments described herein.
Figure 3:
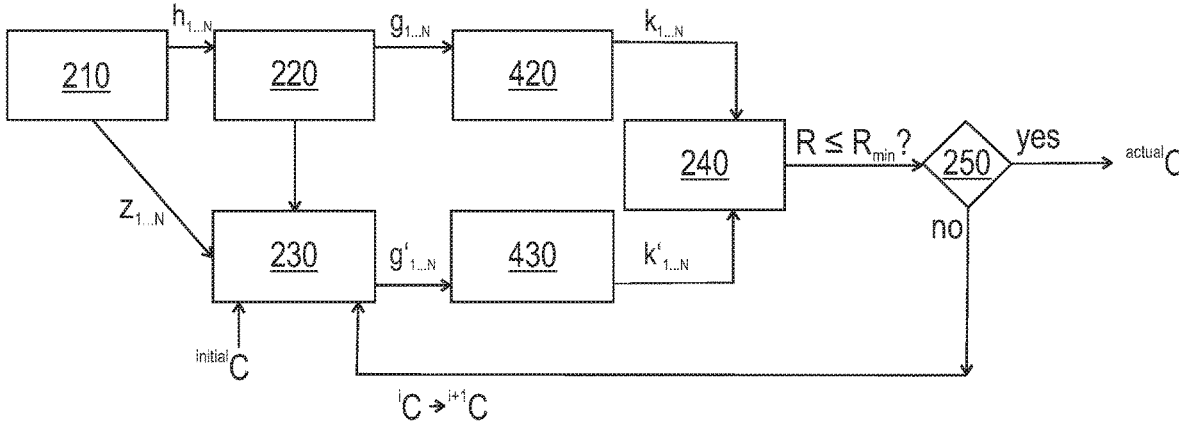
FIG. 3 shows a more detailed diagram illustrating a method as shown in FIG. 2.

FIG. 2 and FIG. 3 are flow diagrams that schematically illustrate such a method of determining at least one beam convergence value according to embodiments described herein. The diagram of FIG. 3 shows optional further details as compared to the more general diagram of FIG. 2.

(a) As is illustrated by boxes 210 and 220 in FIG. 2 and FIG. 3, one or more images $(h_{1 \ldots N})$ of the sample are taken when the sample is arranged at one or more defocus distances $(z_{1 \ldots N})$ from a respective beam focus of the charged particle beam, and one or more retrieved beam profiles $(g_{1 \ldots N})$ are retrieved from the one or more images $(h_{1 \ldots N})$, particularly based on a deconvolution. (b) As is illustrated by box 230 in FIG. 2 and FIG. 3, one or more beam profiles $(g'_{1 \ldots N})$ at the one or more defocus distances $(z_{1 \ldots N})$ are simulated based at least on an estimated beam convergence value, particularly based on an estimated numerical aperture, and optionally based on other known or estimated beam parameter values. (c) As is illustrated by box 240 in FIG. 2 and FIG. 3, a magnitude (R) of a difference between the one or more simulated beam profiles $(g_{1 \ldots N})$ and the one or more retrieved beam profiles $(g'_{1 \ldots N})$ is determined. (d) As is illustrated by box 250 in FIG. 2 and FIG. 3, the estimated beam convergence value is varied in an iterative process for reducing or minimizing said magnitude (R). The beam convergence value that leads to the reduced or minimized magnitude (R) is considered as an actual beam convergence value ($^{actual}C$), particularly as the actual numerical aperture of the charged particle beam. Further details of the above method are described in the following.

In box 210 of FIG. 2 and FIG. 3, one or more images $(h_{1 \ldots N})$ of the sample are taken when the sample is arranged at one or more defocus distances $(z_{1 \ldots N})$, particularly 2 or more, 3 or more, 5 or more, 8 or more or 10 or more different defocus distances, from a respective beam focus of the charged particle beam. A defocus distance is understood herein as the distance ($\neq 0$) between the sample and the beam focus when an image is taken. If an image is taken when the sample is arranged at a defocus distance of the sample relative to the beam focus, the resulting image is an out-of-focus image of the sample. Naturally, an increased defocus distance leads to an increased blurring of the respective taken image, because a beam width generally increases and the resolution generally decreases with the defocus distance.

In some embodiments, a plurality of images, e.g. two, three, five, six, eight, ten or more images, are taken at a plurality of different defocus distances between the sample and the respective beam focus, e.g., at two, three, five, six, eight, ten or more different defocus distances. Specifically, at least one image of the sample may be taken at an overfocus distance, i.e. at a defocus setting in which the sample is arranged further away from the focusing lens 120 than the respective beam focus of the charged particle beam (see defocus distance $z_3$ illustrated in FIG. 1). Furthermore, at least one image of the sample may be taken at an underfocus distance, i.e. at a defocus setting in which the sample is arranged closer to the focusing lens 120 than the respective beam focus of the charged particle beam (see defocus distances $z_1$ and $z_2$ illustrated in FIG. 1). An image taken at a first defocus distance $z_1$ is designated herein as $h_1$, and an image taken at an $n^{th}$ defocus distance $z_n$ is designated herein as $h_n$. A total of N images may be taken, designated herein as $(h_{1 \ldots N})$, in particular N being six or more, e.g., ten or more, or fifteen or more.

In some embodiments, at least one image of the sample may be taken at a defocus distance at which a dependency of the beam profile (e.g., a size or width of the beam profile) on the defocus distance is significantly non-linear. For example, at least one image of the sample may be taken at a defocus distance smaller than 2 times the depth of focus, 1.5 times the depth of focus $(d_{1.5})$, 1.2 times the depth of focus or smaller than the depth of focus. The depth of focus may be described as the distance along the propagation direction of the charged particle beam from a smallest beam waist to a position at which a beam width increases by a factor of $2^{1/2}$. The depth of focus may also be described as the Rayleigh-length.

In some embodiments, the one or more defocus distances $(z_{1 \ldots N})$ where the one or more images $(h_{1 \ldots N})$ are taken are known quantitatively, i.e., in absolute values, e.g. in [μm] or in another length unit. For determining the beam convergence from one or more defocus images, it is beneficial to know quantitatively at which defocus distance (e.g., in [μm]) each of said defocus images has been taken. In some embodiments, a calibration may be conducted before the defocus images of the sample are taken, such that each defocus distance where an image is taken is quantitatively known from the respective setting of the charged particle beam system.

In some embodiments, which can be combined with other embodiments, the defocus distance is varied by moving the sample stage 108 relative to the focusing lens 120 in the Z-direction, i.e. along the optical axis A. A stage movement for varying between a plurality of different defocus distance is schematically depicted in FIG. 1. For example, the sample stage may be moved in predetermined increments, e.g. in a plurality of equal or similar increments of between 0.2 μm and 2 μm, and an image of the sample may be taken at each of the plurality of defocus distances. A constant focal strength of the focusing lens 120 may be maintained while the sample stage is moved and the images are taken.

In other embodiments, the defocus distance is varied by varying a focusing strength of the focusing lens 120. An increased focusing strength of the focusing lens shifts the respective beam focus and the focal plane relative to the sample toward the focusing lens, and a decreased focusing strength shifts the respective beam focus and the focal plane relative to the sample away from the focusing lens, such that the defocus distance is varied by shifting the focal plane pi relative to the sample 10. The sample may remain stationary. In particular, a plurality of different focusing strengths may be applied to the charged particle beam by the focusing lens 120 for varying between the plurality of different defocus distances, and an image may be taken at each of the plurality of different focusing strengths. Alternatively or additionally, an energy of the charged particles of the charged particle beam 11 may be varied in order to vary the defocus distance.

Notably, a focusing strength variation also changes the beam convergence. Therefore, in embodiments described herein, the focusing strength—if varied—is varied only such that the resulting change of defocus distance is negligible relative to the total focal length (f) of the focusing lens 120. For example, the defocus distance may be varied within a total range of several microns (e.g., <10 μm) by varying the focusing strength for taking the plurality of images, whereas the total focal length (f) of the focusing lens 120 may be in the range of several millimeters or even several centimeters. Therefore, the beam convergence may be changed only in a negligible manner by varying the focusing strength of the focusing lens according to embodiments described herein, and the determined numerical aperture (NA) or further beam convergence values are not substantially affected.

In some embodiments, a defocus distance variation as a function of a focusing strength variation of the focusing lens 120 is known in advance or is determined in a preceding calibration, such that, for each focusing strength variation applied by the focusing lens, the respective defocus distance variation is quantitatively known, or for each focusing strength of the focusing lens the respective defocus distance is quantitatively known (e.g., in [μm]).

Returning to FIG. 2 and FIG. 3, in box 220, one or more beam profiles ($g_{1 \ldots N}$) of the charged particle beam at the one or more defocus distances ($z_{1 \ldots N}$) are retrieved from the one or more images ($h_{1 \ldots N}$). In particular, a plurality of beam profiles are retrieved from the plurality of images, namely one retrieved beam profile for each of the plurality of images. Each retrieved beam profile corresponds to the beam profile of the charged particle beam at the defocus distance where the respective image is taken. Out-of-focus beam profiles can be extracted from out-of-focus images via several different beam-profile-extraction methods. One exemplary beam-profile-extraction method is exemplarily explained in the following.

A focus image ($h_f$) of the sample can be taken in addition to the one or more images ($h_{1 \ldots N}$) that are taken out of focus, and said focus image ($h_f$) can be used for retrieving the one or more beam profiles ($g_{1 \ldots N}$) from the one or more images ($h_{1 \ldots N}$). The focus image $h_f$ of the sample can also be otherwise known, for example, because a sample with a known geometry is used for determining the beam convergence according to the methods described herein. The focus image ($h_f$) of the sample can further be known from a simulation or from a measurement using another instrument. A focus image of the sample is also referred to herein as a "high-resolution image" of the sample, the resolution of the high-resolution image being improved relative to the resolution of the one or more images of the sample taken at defocus distances from the respective beam focus, e.g. improved by at least 30% or by at least 50%.

In some implementations, the one or more beam profiles are retrieved from the one or more images based on a deconvolution, particularly a deconvolution with a high-resolution image ($h_f$) of the sample. Specifically, deconvolving a defocus image ($h_n$) with a high-resolution image may result in the respective defocus beam profile ($g_n$) of the charged particle beam (since $h_n \sim h_f \times g_n$). Alternatively or additionally, retrieving the one or more beam profiles ($g_{1 \ldots N}$) from the one or more images ($h_{1 \ldots N}$) may include dividing the one or more images in Fourier space by a high-resolution image of the sample in Fourier space. Such a division in Fourier space can be considered equivalent to a deconvolution.

In some embodiments, retrieving the one or more beam profiles ($g_{1 \ldots N}$) from the one or more images ($h_{1 \ldots N}$) may include Fourier-transforming the one or more images in real space ($h_{1 \ldots N}$) to provide the one or more images in Fourier space ($H_{1 \ldots N}$), and dividing the one or more images in Fourier space ($H_{1 \ldots N}$) by the focus image of the sample in Fourier space ($H_f$). The above beam-profile-extraction method is based on the fact that, in Fourier space, dividing a defocus image ($H_n$) of a sample by the focus image ($H_f$) of the sample removes the structure of the sample, such that said division may yield the pure beam profile, i.e. the beam profile without sample information. Each retrieved beam profile in Fourier space ($G_n$) may be inversely Fourier-transformed for obtaining the respective retrieved beam profile in real space ($g_n$).

Retrieving the one or more beam profiles ($g_{1 \ldots N}$) from the one or more images ($h_{1 \ldots N}$) may optionally include at least one of a multiplication with an adaptive filter term $$G_{1 \ldots N}^{Filter}$$

and a multiplication with a focus beam profile in Fourier space ($G_f$). The adaptive filter term $$G_{1 \ldots N}^{Filter}$$

can be provided by an adaptive filter that may receive the taken images as an input information. An adaptive filter term may be provided individually for each of the taken images by the adaptive filter. Without the adaptive filter term $$G_{1 \ldots N}^{Filter},$$

close-to-zero values of the focus image $H_f$ in the denominator of the above division may lead to an overly strong weight of noise in the focus image. The adaptive filter term $$G_{1 \ldots N}^{Filter}$$

can reduce or avoid such unwanted effects of noise in the focus image $H_f$ in the calculation of the focus beam profiles ($G_{1 \ldots N}$). A respective filter term may be determined by the adaptive filter for each of the images ($h_{1 \ldots N}$) individually, for example in order to make sure that for each image and the respective noise in the image an appropriate filter term is used.

Returning to FIG. 2 and FIG. 3, in box 230, one or more beam profiles at the one or more defocus distances are simulated to provide one or more simulated beam profiles ($g'_{1 \ldots N}$). The simulation can be conducted by the processing unit 170 shown in FIG. 1. The beam profiles may be simulated at the one or more defocus distances at which the one or more images are taken in box 210. In other words, the defocus distances used in box 210 for taking the images are considered in box 230 for simulating the beam profiles. For example, if the one or more images ($h_{1 \ldots N}$) are taken at one or more defocus distances ($z_{1 \ldots N}$), the one or more defocus distances ($z_{1 \ldots N}$) can be forwarded to the processing unit or are otherwise known to the processing unit, and the one or more simulated beam profiles ($g'_{1 \ldots N}$) are defocus beam profiles that look like beam profiles at said defocus distances.

The beam profiles in box 230 can be simulated at each defocus distance based on an estimated beam convergence value of the charged particle beam, particularly based on an estimated numerical aperture (NA), and optionally based on further parameter values of the charged particle beam. An initial estimated beam convergence value ($^{initial}C$) may be estimated, e.g., according to the "first NA-determination method" or the "second NA-determination method" described above.

For example, an initial estimated numerical aperture (NA) of the charged particle beam may be calculated based on a change of size of the one or more retrieved beam profiles as a function of defocus distance. Alternatively, the initial estimated beam convergence value ($^{initial}C$) may be based on known details of beam-optical components of the charged particle beam system or on experience, e.g., on typical beam convergence values of similar charged particle beam systems.

The beam profiles in box 230 may be simulated by wave-optical simulation. The wave-optical simulation may use the estimated beam convergence value of the charged particle beam as an input parameter for the simulation, optionally together with other input parameters that characterize the charged particle beam, such as one or more beam aberration coefficients, a beam landing energy, a beam brightness, a beam spectral width and/or a beam current of the charged particle beam. The wave-optical simulation may comprise a Fourier Transform, particularly a Fast Fourier Transform, and/or may comprise electron optical phase information. If one or more (known or estimated) further parameters of the charged particle beam can be used as input parameters in the simulation of the beam profiles, the simulated beam profiles may more accurately resemble the retrieved beam profiles, such that the iterative method may more quickly converge and/or may provide a more reliable result.

For example, the one or more simulated beam profiles in box 230 may be simulated utilizing also one or more (known or estimated) beam aberration coefficients, such as astigmatism, spherical aberrations, coma and/or chromatic aberration(s) of the charged particle beam. Simulating the one or more beam profiles based on one or more beam aberration coefficients of the actual beam leads to a quicker and/or better convergence of the iterative process toward the reduced or minimized magnitude (R).

In some embodiments, which can be combined with other embodiments described herein, one or more parameters of the charged particle beam may be provided (e.g., estimated), the one or more parameters may be utilized as input parameter(s) for the simulation, and at least some of the parameters may also be varied (together with the variation of the beam convergence value and/or sequentially) in the iterative process to improve the accuracy of the estimated parameters.

For example, the one or more simulated beam profiles are simulated utilizing also one or more (known or estimated) beam aberration coefficients, and the one or more beam aberration coefficients may be varied (together with the estimated beam convergence value) in the iterative process for reducing or minimizing the magnitude (R) to determine beam aberration coefficients that are closer to actual beam aberration coefficients. As such the method described herein may not only be suitable to determine an actual beam convergence value, but also to determine actual values of further beam parameters, such as one or more beam aberration coefficients.

In some embodiments, simulating the one or more simulated beam profiles ($g'_{1 \ldots N}$) may comprise simulating at least one of measurement artifacts or retrieval artifacts that may occur during an image-taking process, an image-processing process or a beam-profile-retrieval process.

As is schematically depicted in FIG. 2 and in FIG. 3, the input data for the simulation in box 230 may include the defocus distances ($z_{1 \ldots N}$) previously used for the taken images ($h_{1 \ldots N}$), and the initial estimated beam convergence value $^{initial}C$ or an updated beam convergence value $^{i+1}C$. Optionally, as described above, one or more further beam parameters may be used for the simulation.

In box 240, the one or more retrieved beam profiles ($g_{1 \ldots N}$) and the one or more simulated beam profiles ($g'_{1 \ldots N}$) are compared for determining a magnitude ($R_i$) of a difference between the one or more retrieved beam profiles ($g_{1 \ldots N}$) and the one or more simulated beam profiles ($g'_{1 \ldots N}$). As is schematically depicted in FIG. 2 and FIG. 3, the one or more retrieved beam profiles ($g_{1 \ldots N}$) and the one or more simulated beam profiles ($g'_{1 \ldots N}$) may be compared to one another in box 240 in real space or in Fourier space.

In some embodiments, the one or more retrieved beam profiles ($g_{1 \ldots N}$) and the one or more simulated beam profiles ($g'_{1 \ldots N}$) may be compared in Fourier space. A comparison in Fourier space may be advantageous because inaccuracies due to an incorrect superposition of a retrieved beam profile and a respective simulated beam profile for the comparison do not appear in Fourier space (when comparing (squared) absolute values of ($G_{1 \ldots N}$) and ($G'1 \ldots N$)) since linear shifts in real space only appear as phase terms in Fourier space.

Comparing in box 240 may include calculating a difference value between each of the one or more retrieved beam profiles ($g_{1 \ldots N}$) and the corresponding simulated beam profile ($g'_{1 \ldots N}$), and summarizing the (optionally squared) difference values to obtain the magnitude (R). When the initial beam convergence value $^{initial}C$ is used in the simulation, the magnitude $R_1$ is calculated. In subsequent iterations, updated estimated beam convergence values $^{i+1}C$ may be respectively used in the simulation, and an updated magnitude ($R_{i+1}$) is calculated with the objective of determining a beam convergence value that leads to a minimized magnitude ($R_{min}$).

After determining the magnitude ($R_i$), the beam convergence value $^iC$ is varied to provide an updated beam convergence value $^{i+1}C$, and the simulation in box 230 and the comparison in box 240 are repeated using the updated beam convergence value $^{i+1}C$ in an iterative process, with an objective of reducing or minimizing the magnitude (R) in an iterative simulation and comparison process.

In particular, the simulation in box 230, the comparison in box 240, and the variation of $^iC$ to provide $^{i+1}C$ may be repeated in an iterative process, until a reduced or minimized magnitude ($R_{min}$) of the difference between the one or more retrieved beam profiles and the one or more simulated beam profiles is obtained, and the respective updated beam convergence value at the respective iteration is considered as the actual beam convergence value $^{actual}C$. Specifically, as is schematically illustrated in box 250 of FIG. 2 and FIG. 3, it may be checked whether $(R_i \leq R_{min})$. If $(R_i \leq R_{min})$, the process may be stopped and $^iC$ may be considered as the actual beam convergence value $^{actual}C$. Otherwise, the iterative process may continue.

In some embodiments, which can be combined with other embodiments described herein, the actual beam convergence value $^{actual}C$ may be employed to tailor the charged particle beam, for example to modify the actual beam convergence value $^{actual}C$ to match a technical specification.

FIG. 3 is a more detailed diagram than the diagram shown in FIG. 2. Specifically, the method illustrated in FIG. 3 corresponds to the method shown in FIG. 2, but shows optional additional operations in boxes 420 and 430. Most of the operations of the method illustrated in FIG. 3 correspond to the respective operations of the method illustrated in FIG. 2, such that reference can be made to the above explanations, which are not repeated here.

In particular, in some embodiments, one or more retrieved beam profile parameters, such as one or more beam profile sizes or beam profile widths $(K_{1 \ldots N})$, may be determined from the one or more retrieved beam profiles $(g_{1 \ldots N})$ in box 420; and one or more simulated beam profile parameters, such as one or more simulated beam profile sizes or beam profile widths $(k'_{1 \ldots N})$, may be determined from the one or more simulated beam profiles $(g'_{1 \ldots N})$ in box 430. Specifically, the beam profile parameters may comprise one or more parameters that describe the beam profile size, the beam profile width (e.g., the profile radius or diameter), a beam profile ellipticity and/or a beam profile homogeneity.

In some embodiments, comparing in box 240 may comprise comparing the one or more retrieved beam profile parameters (e.g., the one or more beam profile widths $(K_{1 \ldots N})$) and the one or more simulated beam profile parameters (e.g., the one or more simulated beam profile widths $(k'_{1 \ldots N})$) to determine the magnitude (R) of a difference between the one or more retrieved beam profiles $(g_{1 \ldots N})$ and the one or more simulated beam profiles $(g'_{1 \ldots N})$. Determining the magnitude (R) of a difference between the one or more retrieved beam profiles $(g_{1 \ldots N})$ and the one or more simulated beam profiles $(g'_{1 \ldots N})$, particularly between the one or more retrieved beam profile parameters and the one or more simulated beam profile parameters, may include calculating a difference value between each of the retrieved beam profile parameters of the one or more retrieved beam profiles and the corresponding simulated beam profile parameter, and summarizing said (optionally squared) difference values to obtain the magnitude (R).

In some embodiments, summarizing the difference values between the beam profile parameters may include weighting the beam profile parameters, particularly using weights determined from experience.

In some embodiments, the one or more retrieved beam profiles $(g_{1 \ldots N})$ may be essentially rotationally symmetric, e.g. circular or Gaussian. In other words, the radial beam width may be essentially independent of the azimuthal angle at which the radial beam width is determined. "Azimuthal angles" as used herein refer to different directions within the cross-sectional planes of the beam profiles, i.e. different directions perpendicular to the optical axis (A) where the width of a beam profile can be measured. If the beam profiles are essentially circular, it may be appropriate to retrieve (only) one beam profile parameter per beam profile, such as a radial beam width (e.g. a beam diameter, a FW50-value or a FWHM-value). Alternatively, an average radial beam width can be determined from each beam profile, for example as an FW50-value, which is the diameter of a circle around the optical axis through which half of the beam current propagates, as a 10/90 or 20/80 knife edge width, or as a D40 width. In some embodiments, a beam profile parameter may comprise two or more parameters that describe the beam profiles, e.g., a beam profile ellipticity.

In some embodiments, which can be combined with other embodiments, each of the one or more beam widths is determined in two or more directions, i.e. at two or more different azimuthal angles. In particular, each of the one or more beam widths can be determined as a function of azimuthal angle $(k_{1 \ldots N}(\theta))$. The respective beam width $k_n$ can be determined in two or more directions, for example at an azimuthal angle $\theta_x$ (=in the x-direction) and at an azimuthal angle $\theta_y$ (=in the y-direction). Specifically, the beam width $k_n$ can be retrieved from the respective beam profiles $g_n$ as a function of azimuthal angle $(k_n(\theta))$. The ellipticity of the beam profile may be determined from one or more beam widths as a function of azimuthal angle $((k_{1 \ldots N})(\theta))$.

In some implementations, the beam cross-sectional shape may be asymmetrical, e.g., elliptical or oval. In this case, the beam convergence value can be described by two or three parameters, for example (1) ellipticity and (2) azimuthal angle of the main axis of the ellipse, or (1) major axis width, (2) minor axis width, and (3) angle. The multiple dimensions of beam convergence value may be varied subsequently and/or in parallel, until the minimized magnitude $(R_{min})$ as a function of all the dimensions of the beam convergence value is obtained. In particular, a multi-dimensional variation routine can be used for varying each of the dimensions of the beam convergence value, for retrieving the beam convergence value by comparison between the retrieved and the simulated beam profiles.

In some embodiments, which can be combined with other embodiments described herein, at least one magnitude of the following group is determined from each beam profile and is considered as the respective beam width: (1) FWHM (=full width at half maximum) at one or more azimuthal angles, or an average FWHM; (2) FW50 (=full width 50) at one or more azimuthal angles, or an average FW50, also referred to as D50-width; (3) $1/e_2$-width; and (4) another commonly used magnitude that describes the beam width. The beam radius or the beam diameter may be considered as the beam width, respectively.

In some embodiments, the actual numerical aperture (NA) of the system is determined at two or more different azimuthal angles.

In some embodiments, which can be combined with other embodiments described herein, the charged particle beam is an electron beam and the charged particle beam system is an electron system, particularly an electron microscope, such as an SEM. The charged particle source may be an electron source, and the detector may be an electron detector.

The electron beam may have one or more of the following properties: a numerical aperture in a range below 30 mrad, particularly in a range from 1 mrad to 5 mrad, a probe current in a range from 10 pA to 10 nA and/or a landing energy in a range from 100 eV to 100 keV. Any one or more of said parameters can be used for the simulation of the beam profiles.

Figure 4:
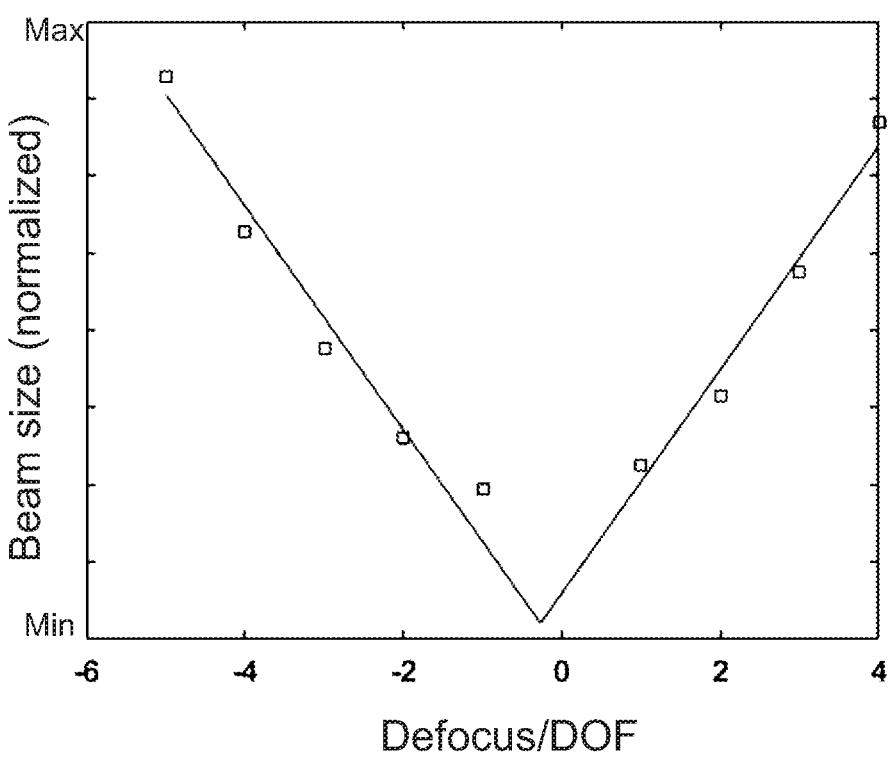
FIG. 4 is a graph showing a retrieved beam profile parameter as a function of a defocus distance determined using any of the methods described herein.
Figure 4:
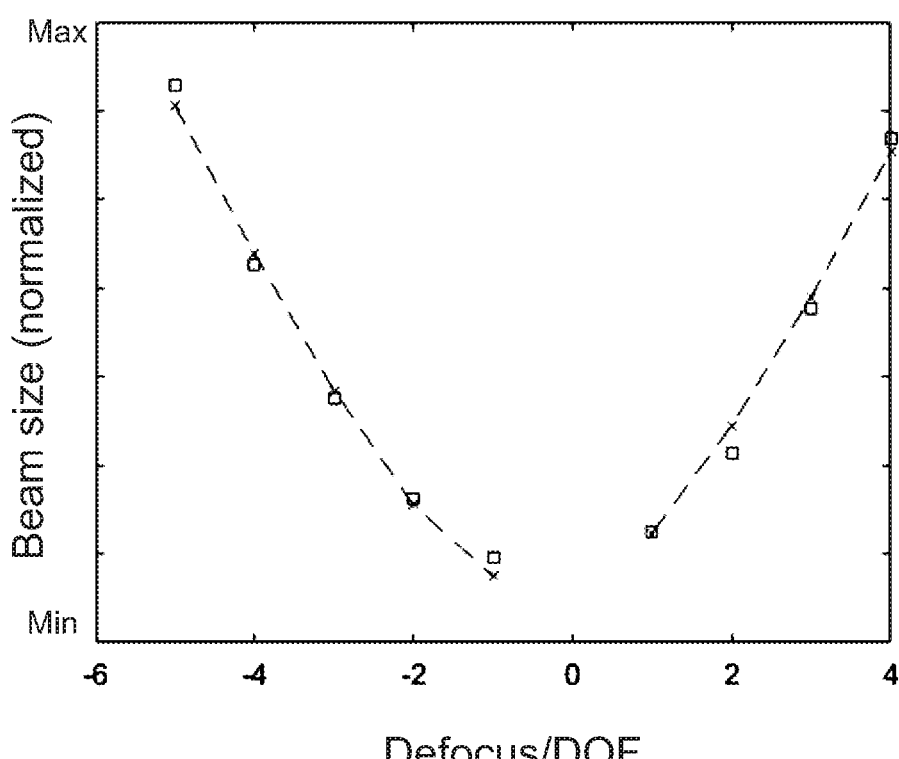

FIG. 4 shows two graphs of a normalized beam size, in particular a normalized beam width, as a function of defocus distance normalized to the depth of focus, DOF. Here, nine images are taken at different (quantitatively known) defocus distances and the respective beam profile widths are retrieved. Both subfigures show the same data. The beam widths ($k_{1 \ldots N}$), determined in box 420, are shown as small squares at the respective defocus distances ($z_{1 \ldots N}$).

In the upper subfigure, the change of beam width as a function of defocus distance is determined as a slope of a line that connects the beam widths (or a linear fit thereto). Typically, the absolute values of the slopes upstream and downstream of the beam focus (defocus distance=0) essentially correspond to one another, because the charged particles of the beam propagate along essentially linear paths.

In the upper subfigure, a non-linearity of the beam width as a function of defocus distance can be seen at small defocus distances. In particular, a data point at approximately –1 DOF defocus distance considerably deviates from the linear fit through the beam widths determined at larger defocus distances.

In the lower subfigure, the beam convergence value, in particular the numerical aperture, is determined according to the methods described in the present disclosure by simulating beam profiles at the respective defocus distances and determining the magnitude (R) of a difference between the one or more simulated beam profiles and the one or more retrieved beam profiles. Simulating beam profiles may consider the above nonlinearity of the beam profile, particularly at small defocus distances, exemplarily at defocus distances smaller than twice the depth of focus.

Simulating beam profiles may further include simulating artifacts from beam profile retrieval, particularly artifacts of thresholding or of a chosen filter size, and/or beam aberrations, if known, such that the accuracy of the NA-determination method can be improved.

In some embodiments, which can be combined with other embodiments described herein, each of the one or more beam widths ($k_{1 \ldots N}$) is determined at two or more azimuthal angles, particularly as a function of azimuthal angle (($k_{1 \ldots N}$)($\theta$)), and respective beam convergence values may be calculated at two or more azimuthal angles or as a function of azimuthal value.

In particular, the at least one beam convergence value may include a first beam convergence value of the charged particle beam at a first azimuthal angle ($\theta_x$) and a second beam convergence value of the charged particle beam at a second azimuthal angle ($\theta_y$). In some embodiments, the at least one beam convergence value can be calculated as a function of the azimuthal angle, for example if the beam profile is highly asymmetric, oval, or otherwise distorted.

In some embodiments, the numerical aperture of the charged particle beam can be calculated at two or more azimuthal angles, particularly as a function of azimuthal angle (NA($\theta$)).

A 3-dimensional model of the focused charged particle beam can be generated and/or displayed, in particular if the beam convergence value is determined as a function of azimuthal angle. Alternatively or additionally, one or more two-dimensional representations of the charged particle beam in one or more selected azimuthal planes can be generated and/or displayed. Alternatively or additionally, one or more one-dimensional representations of a beam width of the charged particle beam as a function of the defocus distance can be generated and/or displayed. Alternatively or additionally, the numerical aperture can be determined and/or displayed, e.g. in a one-dimensional representation, as a function of azimuthal angle.

In some embodiments described herein, one single taken defocus image $h_n$ may already be sufficient for determining the at least one beam convergence value therefrom, particularly if the defocus distance $z_n$ where the one single taken defocus image is taken is known quantitatively (and, in addition, the focus image $h_f$ of the sample is taken or is otherwise known, such that the retrieved beam profile $g_n$ can be retrieved from the one single taken defocus image $h_n$). Specifically, the at least one beam convergence value can be determined by simulating the simulated beam profile $g'_n$ of the charged particle beam based at least on an estimated beam convergence value at the defocus distance $z_n$ and by determining the magnitude (R) of the difference between the retrieved beam profile $g_n$ and the retrieved beam profile $g'_n$ and by varying the estimated beam convergence value in an iterative process for reducing or minimizing said magnitude (R) to determine an actual beam convergence value. A more accurate beam convergence value, particularly a more accurate NA-value, can be determined if a plurality of defocus images ($h_{1 \ldots N}$) is taken at a plurality of different defocus distances ($z_{1 \ldots N}$), and the beam convergence value is determined therefrom as explained herein, particularly both in underfocus and in overfocus.

Known processes for determining beam convergence values are based on the analysis of the beam convergence angle derived from a linear fit on retrieved beam profile widths at different, known, defocus distances. However, known processes are based on a linear approximation of the beam convergence. At small defocus distances, in particular at defocus distances smaller than 2 times the depth of focus, the linear approximation may lead to considerable deviations from an actual beam convergence. In contrast thereto, methods described herein are based on the realization that defocus beam profiles, if taken at quantitatively known defocus distances or at quantitatively known differences therebetween, can be used for comparison with simulated beam profiles based at least on an estimated beam convergence value of the charged particle beam, and that an iterative varying of the estimated beam convergence value to minimize the magnitude (R) of a difference between the one or more simulated beam profiles and the one or more retrieved beam profiles allows to determine the actual beam convergence value. In particular, known beam aberrations or beam profile retrieval artifacts may be incorporated in simulating the simulated beam profiles, which allows a more precise comparison of the retrieved and the simulated beam profiles. In very low numerical aperture embodiments, non-linear effects may be relevant over a wide defocus distance range, resulting in considerable deviations from the actual beam convergence value in known processes. In contrast, methods described herein are suitable for precise determination of the actual beam convergence value in very low numerical aperture embodiments.

Being able to precisely determine the beam convergence value, in particular the numerical aperture, in a charged particle beam system particularly allows for (1) reproducibility and matching, as the numerical aperture is the decisive quantity in determining the obtainable resolution, (2) analysis of beam-influencing elements, e.g. for improving future designs, (3) determination of beam aberrations which scale to various powers of the numerical aperture, (4) generating tailored charged particle beams for certain critical dimensioning and defect review tasks, e.g. for inspecting deep trenches in the sample elongated along only one axis.

An alternative method of determining a beam convergence of a charged particle beam focused by a focusing lens toward a sample in a charged particle beam system does not compare retrieved and simulated defocus beam profiles with each other, but does rather compare taken and simulated defocus images with each other. The alternative method includes: (a) taking one or more images of the sample when the sample is arranged at one or more defocus distances from a respective beam focus of the charged particle beam to provide one or more taken images; (b) simulating one or more images of the sample taken at the one or more defocus distances, based at least on an estimated beam convergence value of the charged particle beam and on a focus image of the sample, in order to provide one or more simulated images; (c) determining a magnitude (R) of a difference between the one or more taken images and the one or more simulated images; and (d) varying the estimated beam convergence value in an iterative process for reducing or minimizing said magnitude (R) to determine an actual beam convergence value.

In (b) of the alternative method, simulating may include, at each defocus distance, simulating a beam profile based at least on the estimated beam convergence value (and optionally on further beam parameters), and calculating a respective simulated image in Fourier space based on a product of the beam profile in Fourier space and the focus image in Fourier space, or based on a convolution in real space. A convolution in real space is considered equivalent to a product in Fourier space.

The alternative method may include some or all of the additional features described with respect to FIG. 2 and FIG. 3, such that reference can be made to the above explanations, which are not repeated here.

Specifically, the following embodiments are described herein:

Embodiment 1: A method of determining a beam convergence of a charged particle beam (11) focused by a focusing lens (120) toward a sample (10) in a charged particle beam system (100), comprising: (a) taking one or more images ($h_{1 \ldots N}$) of the sample when the sample is arranged at one or more defocus distances ($z_{1 \ldots N}$) from a respective beam focus of the charged particle beam, and retrieving one or more retrieved beam profiles ($g_{1 \ldots N}$) from the one or more images ($h_{1 \ldots N}$); (b) simulating one or more beam profiles at the one or more defocus distances ($z_{1 \ldots N}$) based at least on an estimated beam convergence value ($^{initial}C$) of the charged particle beam to provide one or more simulated beam profiles ($g'_{1 \ldots N}$); (c) determining a magnitude (R) of a difference between the one or more simulated beam profiles ($g'_{1 \ldots N}$) and the one or more retrieved beam profiles ($g_{1 \ldots N}$); and (d) varying the estimated beam convergence value in an iterative process for reducing or minimizing said magnitude (R) to determine an actual beam convergence value ($^{actual}C$).

Embodiment 2: The method of embodiment 1, further comprising determining one or more retrieved beam profile parameters from the one or more retrieved beam profiles; and determining one or more simulated beam profile parameters from the one or more simulated beam profiles; wherein determining the magnitude (R) comprises determining the magnitude of the difference between the one or more retrieved beam profile parameters and the one or more simulated beam profile parameters.

Embodiment 3: The method of embodiment 1 or 2, wherein the one or more retrieved beam profile parameters and the one or more simulated beam profile parameters are selected from a group comprising: beam profile sizes, beam profile diameters, and beam profile ellipticities.

Embodiment 4: The method of any of embodiments 1-3, wherein the one or more defocus distances at which the one or more images are taken, or differences between the one or more defocus distances, are known in absolute values, and said absolute values are used for simulating the one or more simulated beam profiles in (b).

Embodiment 5: The method of any of embodiments 1-4, wherein the estimated beam convergence value comprises at least one of a numerical aperture of the charged particle beam, a change of beam width as a function of defocus distance and a beam convergence angle of the charged particle beam.

Embodiment 6: The method of any of embodiments 1-5, wherein, in (b), the one or more simulated beam profiles are simulated utilizing one or more parameters of the charged particle beam, the one or more parameters of the charged particle beam comprising one or more of a beam aberration coefficient, a beam energy and a beam brightness.

Embodiment 7: The method of embodiment 6, wherein the beam aberration coefficient is determined in a preceding aberration determination process, or wherein the beam aberration coefficient utilized in (b) is an estimated coefficient that is varied in (d) to determine an actual beam aberration coefficient.

Embodiment 8: The method of any of embodiments 1-7, wherein, in (b), the one or more beam profiles are simulated based on a wave-optical simulation.

Embodiment 9: The method of any of embodiments 1-8, wherein at least one of the one or more images is taken when the sample is arranged at a defocus position within 1.5 times a depth of focus of the charged particle beam.

Embodiment 10: The method of any of embodiments 1-9, wherein in (a), a plurality of images is taken when the sample is arranged at a plurality of different defocus distances and a plurality of beam profiles is retrieved from the plurality of images; and in (b), a plurality of beam profiles is simulated at the plurality of different defocus distances.

Embodiment 11: The method of any of embodiments 1-10 wherein, in (a), a focus position of the charged particle beam is varied for varying between the plurality of different defocus distances.

Embodiment 12: The method of embodiment 11, wherein, the focus position of the charged particle beam is varied by varying at least one of a magnetic lens setting, an electric lens setting or the beam energy.

Embodiment 13: The method of any of embodiments 1-12, wherein, in (a), a sample stage is moved relative to the focus of the charged particle beam for varying between the plurality of different defocus distances.

Embodiment 14: The method of any of embodiments 1-13, further comprising modifying at least one beam influencing element based on the actual beam convergence value for tailoring or correcting the charged particle beam.

Embodiment 15: The method of any of embodiments 1-14, further comprising: taking or providing a high-resolution image or focus image of the sample with a second resolution that is higher than a first resolution of the one or more images taken in (a).

Embodiment 16: The method of embodiment 15, wherein, in (a), the one or more retrieved beam profiles of the charged particle beam are retrieved by deconvolving the one or more images with the high-resolution image or focus image of the sample.

Embodiment 17: The method of embodiment 15, wherein, in (a), retrieving the one or more retrieved beam profiles from the one or more images comprises dividing the one or more images in Fourier space by a high-resolution image of the sample, or wherein the one or more retrieved beam profiles are retrieved from the one or more images based on a deconvolution.

Embodiment 18: The method of embodiment 16 or 17, wherein retrieving the one or more retrieved beam profiles from the one or more images further comprises an application of an adaptive filter.

Embodiment 19: The method of any of embodiments 1-18, wherein (b), (c) and (d) are repeated until a minimized magnitude (R) of the difference between the one or more simulated beam profiles and the one or more retrieved beam profiles is determined, and the estimated beam convergence value at the respective iteration is determined as the actual beam convergence value of the charged particle beam.

Embodiment 20: The method of any of embodiments 1-19, wherein an initial estimated beam convergence value used in (b) is calculated based on a change of the one or more retrieved beam profiles as a function of defocus distance.

Embodiment 21: The method of any of embodiments 1-20, wherein the charged particle beam is an electron beam focused on the sample with one or more of the following parameters: a numerical aperture in a range below 30 mrad, a probe current in a range from 10 pA to 10 nA, a landing energy in a range from 100 eV to 100 keV.

Embodiment 22: A method of determining a beam convergence of a charged particle beam focused by a focusing lens toward a sample in a charged particle beam system, comprising (a) taking one or more images of the sample when the sample is arranged at one or more defocus distances from a respective beam focus of the charged particle beam to provide one or more taken images; (b) simulating one or more images of the sample taken at the one or more defocus distances based at least on an estimated beam convergence value of the charged particle beam and on a focus image of the sample to provide one or more simulated images; (c) determining a magnitude (R) of a difference between the one or more taken images and the one or more simulated images; and (d) varying the estimated beam convergence value in an iterative process for reducing or minimizing said magnitude (R) in order to determine an actual beam convergence value.

Embodiment 23: The method of embodiment 22 in combination with the additional features of any of embodiments 4-15 and/or 19-21.

Embodiment 24: A charged particle beam system, comprising: a charged particle source for emitting a charged particle beam propagating along an optical axis; a sample stage; a focusing lens for focusing the charged particle beam toward a sample placed on the sample stage; a charged particle detector for detecting signal particles emitted from the sample; and a processor and a memory storing instructions that, when executed by the processor, cause the charged particle beam system to perform the method of any of embodiments 1 to 23.

While the foregoing is directed to embodiments, other and further embodiments may be devised without departing from the basic scope thereof, and the scope thereof is determined by the claims that follow.

What is claimed:

1. A method of determining a beam convergence of a charged particle beam focused by a focusing lens towards a sample in a charged particle beam system, comprising
(a) taking one or more images of the sample when the sample is arranged at one or more defocus distances from a respective beam focus of the charged particle beam, and retrieving one or more retrieved beam profiles from the one or more images;
(b) simulating one or more beam profiles at the one or more defocus distances based at least on an estimated beam convergence value of the charged particle beam to provide one or more simulated beam profiles;
(c) determining a magnitude (R) of a difference between the one or more simulated beam profiles and the one or more retrieved beam profiles; and
(d) varying the estimated beam convergence value in an iterative process for reducing or minimizing said magnitude (R) to determine an actual beam convergence value.

2. The method of claim 1, further comprising
determining one or more retrieved beam profile parameters from the one or more retrieved beam profiles; and
determining one or more simulated beam profile parameters from the one or more simulated beam profiles,
wherein determining the magnitude (R) comprises determining the magnitude of the difference between the one or more retrieved beam profile parameters and the one or more simulated beam profile parameters.

3. The method of claim 2, wherein the one or more retrieved beam profile parameters and the one or more simulated beam profile parameters are selected from a group comprising: beam profile sizes, beam profile widths, beam profile diameters, and beam profile ellipticities.

4. The method of claim 1, wherein the one or more defocus distances at which the one or more images are taken, or differences between the one or more defocus distances, are known in absolute values, and said absolute values are used for simulating the one or more simulated beam profiles in (b).

5. The method of claim 1, wherein the estimated beam convergence value comprises at least one of a numerical aperture of the charged particle beam, a change of beam width as a function of defocus distance, and a beam convergence angle of the charged particle beam.

6. The method of claim 1, wherein, in (b), the one or more simulated beam profiles are simulated utilizing one or more parameters of the charged particle beam, the one or more parameters of the charged particle beam comprising one or more of a beam aberration coefficient, a beam energy, and a beam brightness.

7. The method of claim 6, wherein the beam aberration coefficient is determined in a preceding aberration determination process, or wherein the beam aberration coefficient utilized in (b) is an estimated coefficient that is varied in (d) to determine an actual beam aberration coefficient.

8. The method of claim 1, wherein, in (b), the one or more beam profiles are simulated based on a wave-optical simulation.

9. The method of claim 1, wherein at least one of the one or more images is taken when the sample is arranged at a defocus position within 1.5 times a depth of focus of the charged particle beam.

10. The method of claim 1, wherein
in (a), a plurality of images is taken when the sample is arranged at a plurality of different defocus distances and a plurality of beam profiles is retrieved from the plurality of images; and,
in (b), a plurality of beam profiles is simulated at the plurality of different defocus distances.

11. The method of claim 10, wherein, in (a), a focus position of the charged particle beam is varied for varying between the plurality of different defocus distances.

12. The method of claim 10, wherein, in (a), a sample stage is moved relative to the focus of the charged particle beam for varying between the plurality of different defocus distances.

13. The method of claim 1, further comprising modifying at least one beam-influencing element based on the actual beam convergence value for tailoring the charged particle beam.

14. The method of claim 1, further comprising:

taking or providing a high-resolution image or focus image of the sample with a second resolution that is higher than a first resolution of the one or more images taken in (a), wherein, in (a), the one or more retrieved beam profiles of the charged particle beam are retrieved by deconvolving the one or more images with the high-resolution image or focus image of the sample.

15. The method of claim 14, wherein retrieving the one or more retrieved beam profiles from the one or more images further comprises an application of an adaptive filter.

16. The method of claim 1, wherein (b), (c) and (d) are repeated until a minimized magnitude (R) of the difference between the one or more simulated beam profiles and the one or more retrieved beam profiles is determined, and the estimated beam convergence value at the respective iteration is determined as the actual beam convergence value of the charged particle beam.

17. The method of claim 1, wherein an initial estimated beam convergence value used in (b) is calculated based on a change of the one or more retrieved beam profiles as a function of defocus distance.

18. The method of claim 1, wherein the charged particle beam is an electron beam focused on the sample with one or more of the following parameters: a numerical aperture in a range below 30 mrad, a probe current in a range from 10 pA to 10 nA, a landing energy in a range from 100 eV to 100 keV.

19. A method of determining a beam convergence of a charged particle beam focused by a focusing lens toward a sample in a charged particle beam system, comprising (a) taking one or more images of the sample when the sample is arranged at one or more defocus distances from a respective beam focus of the charged particle beam to provide one or more taken images;

(b) simulating one or more images of the sample taken at the one or more defocus distances based at least on an estimated beam convergence value of the charged particle beam and on a focus image of the sample to provide one or more simulated images;

(c) determining a magnitude (R) of a difference between the one or more taken images and the one or more simulated images; and (d) varying the estimated beam convergence value in an iterative process for reducing or minimizing said magnitude (R) to determine an actual beam convergence value.

20. A charged particle beam system, comprising:

a charged particle source for emitting a charged particle beam propagating along an optical axis;

a sample stage;

a focusing lens for focusing the charged particle beam toward a sample placed on the sample stage;

a charged particle detector for detecting signal particles emitted from the sample; and a processor and a memory storing instructions that, when executed by the processor, cause the charged particle beam system to:

(x1) simulate one or more beam profiles at one or more defocus distances based at least on an estimated beam convergence value of the charged particle beam to provide one or more simulated beam profiles, (x2) compare one or more retrieved beam profiles retrieved from one or more images of the sample taken at the one or more defocus distances and the one or more simulated beam profiles for determining a magnitude of a difference therebetween; and (x3) vary the estimated beam convergence value in an iterative process for reducing or minimizing said magnitude to determine an actual beam convergence value.

* * * * *